United States Patent [19]
Hinterscher

[11] Patent Number: 6,097,229
[45] Date of Patent: Aug. 1, 2000

[54] BUS-HOLD CIRCUIT HAVING LOW LEAKAGE WHEN POWER IS OFF

[75] Inventor: Gene B. Hinterscher, McKinney, Tex.

[73] Assignee: Texas Instruments Incorporated, Dallas, Tex.

[21] Appl. No.: 09/143,702

[22] Filed: Aug. 28, 1998

Related U.S. Application Data

[60] Provisional application No. 60/056,588, Aug. 28, 1997.

[51] Int. Cl.[7] ...................................................... H03K 3/12
[52] U.S. Cl. ............................................. 327/199; 326/86
[58] Field of Search ........................ 326/86, 90; 327/199, 327/208, 210, 214, 223, 225

[56] References Cited

U.S. PATENT DOCUMENTS

| | | | |
|---|---|---|---|
| 5,812,002 | 9/1998 | Yoshida | 327/210 |
| 5,903,180 | 5/1999 | Hsia et al. | 327/333 |
| 5,973,530 | 10/1999 | Morris et al. | 327/210 |

*Primary Examiner*—Jeffrey Zweizig
*Attorney, Agent, or Firm*—Wade James Brady, III; Frederick J. Telecky, Jr.

[57] ABSTRACT

A bus-hold circuit includes an inverter (10) having an input (4) and an output (16). A first transistor (22) has a gate coupled to the output (16). A second transistor (20) has a source-drain current pat coupled in series with the current path of the first transistor (22) between a power supply terminal and a reference terminal. A third transistor (28) has a source-drain current path coupled between the gates of the first and second transistors (22, 20) and a gate coupled to the power supply terminal. A fourth transistor (30) has a source-drain current coupled between the gate of the second transistor (20) and the input and a gate coupled to the power supply terminal. A resistor (26) has a first terminal coupled to the source-drain current pats of the first and second transistors (22, 20) and a second terminal coupled to the input. The bush old circuit eliminates the need for a Schottky diode and allows near rail-to-rail bus operation.

5 Claims, 1 Drawing Sheet

BUS-HOLD CIRCUIT HAVING LOW LEAKAGE WHEN POWER IS OFF

This application claims priority under 35 USC § 119(e)(1) of provisional application number 60/056,588 filed Aug. 28, 1997.

BACKGROUND OF THE INVENTION

A bus-hold circuit allows a bus to be held at a selected voltage level. It is desirable that leakage current from a path through the power source terminals of a device not be allowed to flow in connection with a power-out condition for the circuit. In such a situation, the current could effectively result in causing a short to circuit ground from the power supply which could ground or unnecessarily load the bus. Ioff is defined as the maximum leakage current into/out of the input/output transistors when forcing the input/output to a given DC voltage with the circuit supply voltage being equal to zero. An Ioff test simulates the power-out condition by taking the circuit supply voltage to zero and measuring the current along a path from the input terminal to a bus to the circuit power supply. This power-out condition can be caused in connection with deliberately saving power to various application devices which may be connected to a bus such as a printer, or power-out can be brought about by a malfunction of an application.

Prior art bus-hold circuits introduce Schottky diodes in the current path of the bus-hold circuit. This is undesirable since Schottky diodes can introduce leakage current by nature. This is incongruous to the favored characteristic of CMOS (complementary metal-oxide-semiconductor) of extremely low standby current. Additionally, some CMOS technologies are implemented by processes which cannot adequately process Schottky diodes. Also as the supply voltage becomes lower (i.e. 2.5 v, 1.8 v), the voltage drop across the diode will become more of a factor on the current needed for the given bus-hold current specification.

FIG. 1 is a schematic drawing of a prior art CMOS bus-hold circuit having a Schottky diode. Bus 2 is connected to input 4 and electrostatic discharge circuit 6 couple to bus-hold circuit 8. Inverter 10 comprising p-channel transistor 12 and n-channel transistor 14 with common connections between respective gates and drains, is coupled to input 4 and output 16. Inverter 18 comprising p-channel transistor 20 and n-channel transistor 22 with common connections between respective gates and drains, is connected to output 16 at the input of inverter 18 (the gates of transistors 20 and 22). Together inverter 10 and 18 serve as a latch. Schottky diode 24 through resistor 26 provides a path through which bus-hold circuit 8 can latch data on bus 2. Schottky diode 24 lessens the likelihood of significant Ioff current in a path from input 4 to Vdd during a power-out condition. However, during normal bus-hold operation of circuit 8, Schottky diode 24 limits the rail-to-rail operation of the bus due to the voltage drop which can occur across diode 24. Diode 24's voltage drop becomes more of a factor as the supply voltage becomes lower (i.e. Vdd 2.5 v, 1.8 v). The latching operation of the bus-hold circuit occurs when a logic one or logic zero is input to the gates of transistors 12 and 14 of inverter 10. An inverted state at output 16 of inverter 10 is input to inverter 18 which produces a logic state which is an inversion of the logic state at output 16. This state holds the logic on bus 2.

Figure 1:
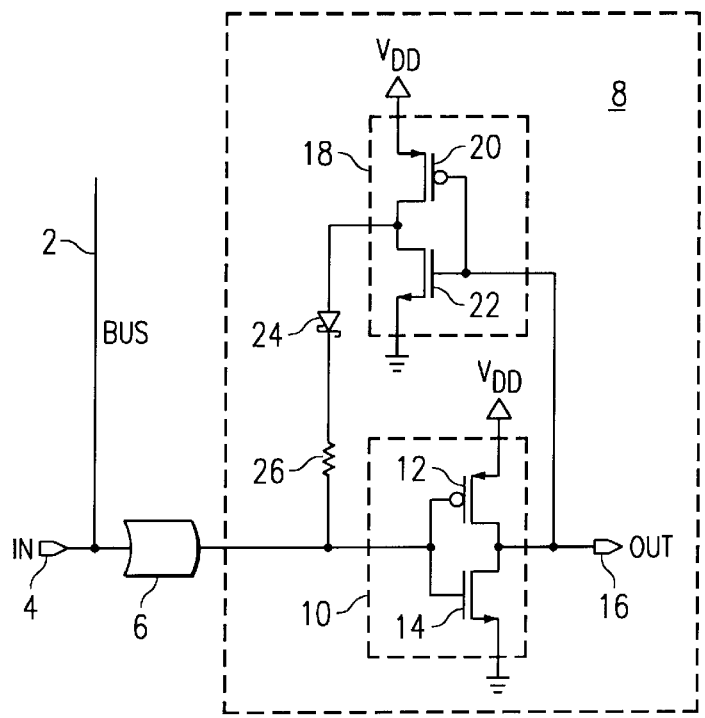
FIG. 1 is a schematic drawing of a prior art CMOS bus-hold circuit having a Schottky diode.

Reference numerals are carried forward.

DETAILED DESCRIPTION OF THE INVENTION

Figure 2:
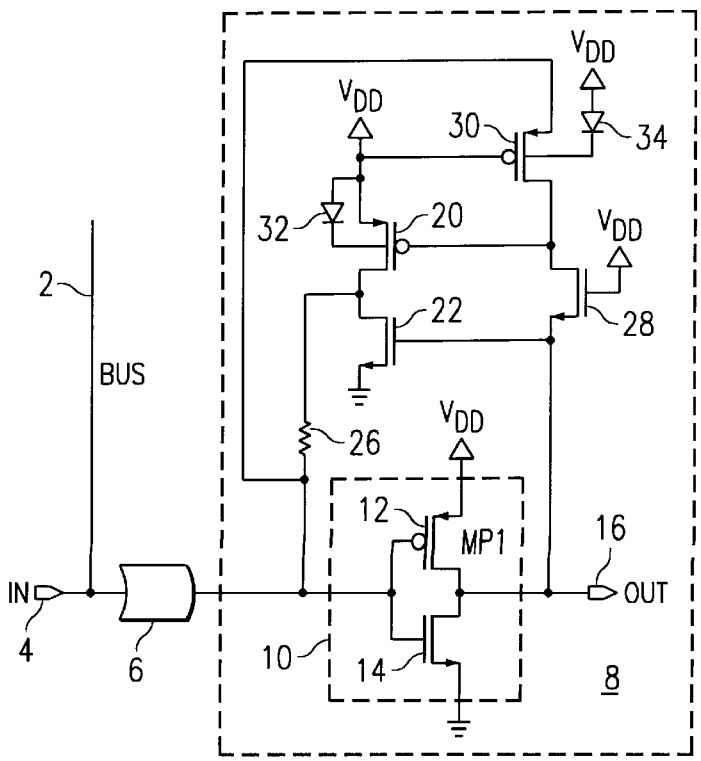
FIG. 2 illustrates a schematic drawing of the bus-hold circuit which includes n-channel transistor 28 and p-channel transistor 30 with its gates coupled to the circuit supply voltage Vdd. It also includes the current limiting diodes 32 and 34.

The bus-hold circuit of the invention eliminates the need for a Schottky diode and more nearly allows rail-to-rail bus operation. FIG. 2 illustrates a schematic drawing of the bus-hold circuit which includes n-channel transistor 28 with its gate coupled to the circuit supply voltage Vdd. P-channel transistor 30 is coupled to the body of transistor 20 and is further connected to transistor 28 and ESD circuit 6. Diode 32 provides current blocking for transistor 20's parasitic pmoat-nwell diode during an Ioff test. Diode 34 provides current blocking for transistors 30's parasitic pmoat-nwell diode during an Ioff test. In normal bus-hold operation, transistor 28, powered by the Vdd circuit supply voltage at its gate, couples the gates of transistors 20 and 22 together so that transistor 20 and 22 act in concert as inverters. Consequently, a logic low input to the gates of inverter 10 result in logic high value at output 16 which results in transistor 22 pulling bus 2 to near ground level through resistor 26. Alternatively, a logic high input to input 4 results in transistor 20's gate being pulled low by transistor 28 through transistor 14. Thus, bus 2 is pulled up to near the Vdd voltage supply through a path through resistor 26.

During a Ioff test, Vdd is dropped to zero volts and a logic high value (e.g. 1.8 volts to 5 volts) is placed on input 4 and bus 2. Transistor 30 turns on thus connecting the gate of transistor 20 to input 4. This shuts transistor 20 off, thus turning off current flow in a path from Vdd through resistor 26 to ground.

The foregoing invention can be implemented on a semiconductor integrated circuit using conventional fabrication methods. N-channel transistors can be substituted for p-channel transistors and vice-versa with appropriate conventional modifications.

Although the invention has been described in detail herein with reference to the preferred embodiments and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by persons or ordinary skill in the art having reference to this description. It is contemplated that all such changes and additional embodiments are within the spirit and true scope of the invention as claimed below.

What is claimed is:

1. A bus-hold circuit comprising:
   an inverter having an input and an output;
   a first transistor of a first conductivity type having a source-drain current path and a gate coupled to said output;
   a second transistor of a second conductivity type having a source-drain current path and a gate, the source-drain current paths of said first and second transistors being coupled in series between a power supply terminal and a reference terminal;
   a third transistor of said first conductivity type having a source-drain current path coupled between the gates of said first and second transistors and a gate coupled to said power supply terminal;

a fourth transistor of said second conductivity type having a source-drain current path and a gate, the source-drain current path of said fourth transistor coupled between the gate of said second transistor and said input, the gate of said fourth transistor coupled to said power supply terminal; and a resistor having a first terminal coupled to the source-drain current paths of said first and second transistors and a second terminal coupled to said input.

2. The bus-hold circuit of claim 1, further comprising a diode having an anode coupled to said power supply terminal and a cathode coupled to the body of said second transistor.

3. The bus-hold circuit of claim 1, further comprising a diode having an anode coupled to said power supply terminal and a cathode coupled to the body of said fourth transistor.

4. The bus-hold circuit of claim 1, wherein said first conductivity type is n-channel and the second conductivity type is p-channel.

5. The bus-hold circuit of claim 1, wherein in a first mode of operation a first voltage at the power supply terminal turns the third transistor on to cause the first and second transistors to operate as an inverter and in a second mode of operation a second voltage at the power supply terminal turns the fourth transistor on and a logic high value at said input turns the second transistor off.

* * * * *